United States Patent
Cunningham (12)

(10) Patent No.: US 6,521,532 B1
(45) Date of Patent: Feb. 18, 2003

(54) METHOD FOR MAKING INTEGRATED CIRCUIT INCLUDING INTERCONNECTS WITH ENHANCED ELECTROMIGRATION RESISTANCE

(76) Inventor: James A. Cunningham, 19771 Junipero Way, Saratoga, CA (US) 95070

( * ) Notice: Subject to any disclaimer, the term of this patent is extended or adjusted under 35 U.S.C. 154(b) by 0 days.

(21) Appl. No.: 09/619,587

(22) Filed: Jul. 19, 2000

Related U.S. Application Data

(60) Provisional application No. 60/145,036, filed on Jul. 22, 1999.

(51) Int. Cl.⁷ .............................................. H01L 21/44
(52) U.S. Cl. ..................... 438/687; 438/686; 438/678; 438/672; 438/650; 438/643; 438/637; 438/627; 438/629
(58) Field of Search ................................. 438/687, 686, 438/678, 672, 650, 643, 637–640, 629, 627, 675

(56) References Cited

U.S. PATENT DOCUMENTS

| | | | |
|---|---|---|---|
| 4,233,067 A | 11/1980 | Sawada ........................ | 75/153 |
| 4,592,891 A | 6/1986 | Nishikawa et al. .......... | 420/491 |
| 4,732,731 A | 3/1988 | Asai et al. ................... | 420/473 |
| 4,750,029 A | 6/1988 | Futatsuka et al. ............. | 357/67 |
| 4,908,275 A | 3/1990 | Tsuji et al. ................... | 428/458 |
| 4,986,856 A | 1/1991 | Tanigawa et al. ....... | 148/11.5 C |
| 5,130,274 A | 7/1992 | Harper et al. ................ | 437/195 |
| 5,143,867 A | 9/1992 | D'Heurle et al. ............ | 437/188 |
| 5,592,024 A | 1/1997 | Aoyama et al. ............. | 257/751 |
| 5,624,506 A | 4/1997 | Tsuzaki et al. .............. | 148/433 |
| 5,674,787 A | * 10/1997 | Zhao et al. ................... | 438/627 |
| 5,694,184 A | 12/1997 | Yamada et al. ................ | 349/43 |
| 5,719,447 A | 2/1998 | Gardner ....................... | 257/762 |
| 5,789,320 A | 8/1998 | Andricacos et al. ......... | 438/678 |
| 5,830,563 A | 11/1998 | Shimoto et al. ............. | 428/209 |
| 6,037,257 A | 3/2000 | Chiang et al. ............... | 438/687 |
| 6,037,664 A | 3/2000 | Zhao et al. ................... | 257/758 |
| 6,060,892 A | 5/2000 | Yamagata .................... | 324/754 |
| 6,066,892 A | 5/2000 | Ding et al. ................... | 257/751 |
| 6,077,780 A | 6/2000 | Dubin ........................... | 438/687 |
| 6,100,194 A | * 8/2000 | Chan et al. .................. | 438/686 |

(List continued on next page.)

FOREIGN PATENT DOCUMENTS

| | | | |
|---|---|---|---|
| JP | 60110868 | 6/1985 | ............. C23C/8/42 |
| JP | 62127438 | 6/1987 | ............. C22C/9/00 |
| JP | 62133050 | 6/1987 | ............. C22F/1/08 |
| JP | 1028337 | 1/1989 | ............. C22C/9/06 |
| JP | 1056842 | 3/1989 | ............. C22C/9/00 |
| JP | 2230756 | 9/1990 | ........... H01L/21/80 |
| JP | 9157775 | 6/1997 | ............. C22C/9/00 |
| JP | 10008167 | 1/1998 | ............. C22C/9/04 |

*Primary Examiner*—Tuan H. Nguyen
*Assistant Examiner*—Thanh Nguyen
(74) *Attorney, Agent, or Firm*—Allen, Dyer, Doppelt, Milbrath & Gilchrist, P.A.

(57) ABSTRACT

A method for making an integrated circuit device includes forming at least one interconnect structure adjacent a semiconductor substrate and including a copper portion and at least one barrier layer adjacent to the copper portion, and displacement plating surface portions of the copper portion with a plating metal more noble than copper and different than copper. The method including displacement plating provides selective and self-limiting thickness plating and enhances the electromigration resistance of the interconnect structure. The displacement plating may include subjecting the copper portion to a plating bath including the plating metal. Because displacement plating is used and is not an electroless plating process, the concentration of the metal in the aqueous plating bath and the plating time are not critical. The method may further include annealing the integrated circuit device after the displacement plating to diffuse the plating metal into the copper portion. The plating metal may comprise at least one of silver, gold, mercury, rhodium, palladium, iridium, and platinum.

33 Claims, 3 Drawing Sheets

U.S. PATENT DOCUMENTS

| | | | | |
|---|---|---|---|---|
| 6,100,195 A | * | 8/2000 | Chan et al. | 438/637 |
| 6,136,707 A | * | 10/2000 | Cohen | 438/687 |
| 6,140,234 A | * | 10/2000 | Uzoh et al. | 438/670 |
| 6,143,422 A | * | 11/2000 | Nagai et al. | 428/223 |
| 6,147,402 A | | 11/2000 | Joshi et al. | 257/751 |
| 6,157,081 A | | 12/2000 | Nariman et al. | 257/752 |
| 6,174,799 B1 | | 1/2001 | Lopatin et al. | 438/627 |
| 6,180,523 B1 | * | 1/2001 | Lee et al. | 438/678 |
| 6,181,012 B1 | * | 1/2001 | Edelstein et al. | 257/762 |
| 6,197,688 B1 | * | 3/2001 | Simpson | 438/629 |
| 6,214,728 B1 | * | 4/2001 | Chan et al. | 438/678 |
| 6,249,055 B1 | * | 6/2001 | Dubin | 257/751 |

* cited by examiner

METHOD FOR MAKING INTEGRATED CIRCUIT INCLUDING INTERCONNECTS WITH ENHANCED ELECTROMIGRATION RESISTANCE

RELATED APPLICATION

This application is based upon prior filed copending provisional application Serial No. 60/145,036 filed Jul. 22, 1999, the entire disclosure of which is incorporated herein by reference.

FIELD OF THE INVENTION

The present invention relates to the field of integrated circuits and integrated circuit manufacturing, and more particularly, to making interconnection structures with enhanced electromigration resistance, and while not significantly increasing the resistivity of the metal.

BACKGROUND OF THE INVENTION

A metal interconnect system in wide use in the late 1990's included an Al+Cu alloy interconnect line clad on each side with a barrier metal, and combined with planarized tungsten plugs for vias. A via is the structure that provides the electrical connection from one vertical level of interconnects to the next. The system saw wide acceptance in the industry, especially for high performance logic applications, such as microprocessor chips. The system was perceived as satisfactory, except that a severe degradation in electromigration resistance was noted on test patterns with multiple levels of interconnects and tungsten plug vias, versus test patterns using one interconnect level and no vias.

As much as a 100 times reduction in median-time-to-failure ($T_{50}$) values, or more, were noted. One technical paper covering this phenomenon in detail is by R. G. Filippi et al., entitled, "The Effect of Copper Concentration on the Electromigration of Layered Aluminum-Copper (Ti—AlCu—Ti) Metallurgy With Tungsten Diffusion Barriers." The paper appears in the 1992 VMIC Conference Proceedings, on page 359. The researchers showed that the copper doping is swept away from the tungsten in the direction of current flow. The aluminum, then depleted of its copper, electromigrates rapidly and voids appear at or near the W/Al interface. Increasing the concentration of copper helps to a limited extent, but degrades the resistivity. Stripes with a close by "reservoir" of copper also showed improvement, but none of these measures completely solved the problem. In general, the phenomenon may be referred to as a flux divergence at a dissimilar material interface.

A similar phenomenon has been noted in a copper system with tungsten plugs. This was reported, for example, by Kazuhide Abe, et al., and coworkers in a paper entitled, "Cu Damascene Interconnects with Crystallographic Texture Control and Its Electromigration Performance," and appears in the IEEE 1998 Reliability Physics Symposium Proceedings on page 342.

The widely-accepted dual Damascene copper system does not use tungsten plugs between interconnect levels, but does employ a barrier metal. This barrier layer lies, in general, between the upper surface of a copper interconnect and the bottom of an overlying copper via. Thus, some flux divergence may occur at this interface at high current density. The location of the copper metal depletion depends on the direction of current flow. For example, if the current flows up into overlying metal, this is the area of voiding and damage.

SUMMARY OF INVENTION

In view of the foregoing background, it is therefore an object of the invention to provide a integrated circuit processing method which eliminates or significantly diminishes the flux divergence phenomenon such that little degradation of electromigration resistance occurs at the via structures relative to other regions in the interconnect system.

Another object of the invention is to provide a thin, hardened alloy skin on selected copper surfaces to increase electromigration resistance and/or provide for passivation.

These and other objects, features and advantages in accordance with the present invention are provided by a method for making an integrated circuit device comprising forming at least one interconnect structure adjacent a semiconductor substrate and comprising a copper portion and at least one barrier layer adjacent to the copper portion, and displacement plating surface portions of the copper portion with a plating metal more noble than copper and different than copper. The method including displacement plating provides selective and self-limiting thickness plating and enhances the electromigration resistance of the interconnect structure.

The displacement plating may include subjecting the copper portion to a plating bath including the plating metal. Because displacement plating is used and is not an electroless plating process, the concentration of the metal in the aqueous plating bath and the plating time are not critical.

The method may further include annealing the integrated circuit device after the displacement plating to diffuse the plating metal into the copper portion. For example, the displacement plating and annealing may form an electromigration resistant region having a thickness less than about 100 Å.

The plating metal may comprise at least one of silver, gold, mercury, rhodium, palladium, iridium, and platinum. In some embodiments, the copper portion comprises an interconnect line, and the displacement plating is performed after forming the interconnect line and before forming the at least one barrier layer. In other embodiments, the copper portion comprises a copper seed layer formed on the at least one barrier layer, and displacement plating is performed after forming the seed layer on the at least one barrier layer. In other words, in these embodiments the plating layer is formed on an upper surface of the seed layer opposite the underlying barrier layer. Of course, in some embodiments, both techniques can be used.

In accordance with another aspect of the invention, the copper seed layer may be a doped copper seed layer including at least one of calcium, cadmium, zinc, neodymium, tellurium, and ytterbium. This may further improve or enhance the electromigration resistance.

The method may also include electroplating additional copper onto the displacement plated copper seed layer, such as to fill an opening in a dielectric layer and thereby provide a vertical interconnection or via for the device. In addition, the at least one barrier layer may comprise one of tantalum nitride and tantalum silicon nitride.

DETAILED DESCRIPTION OF THE PREFERRED EMBODIMENTS

Figure 1:
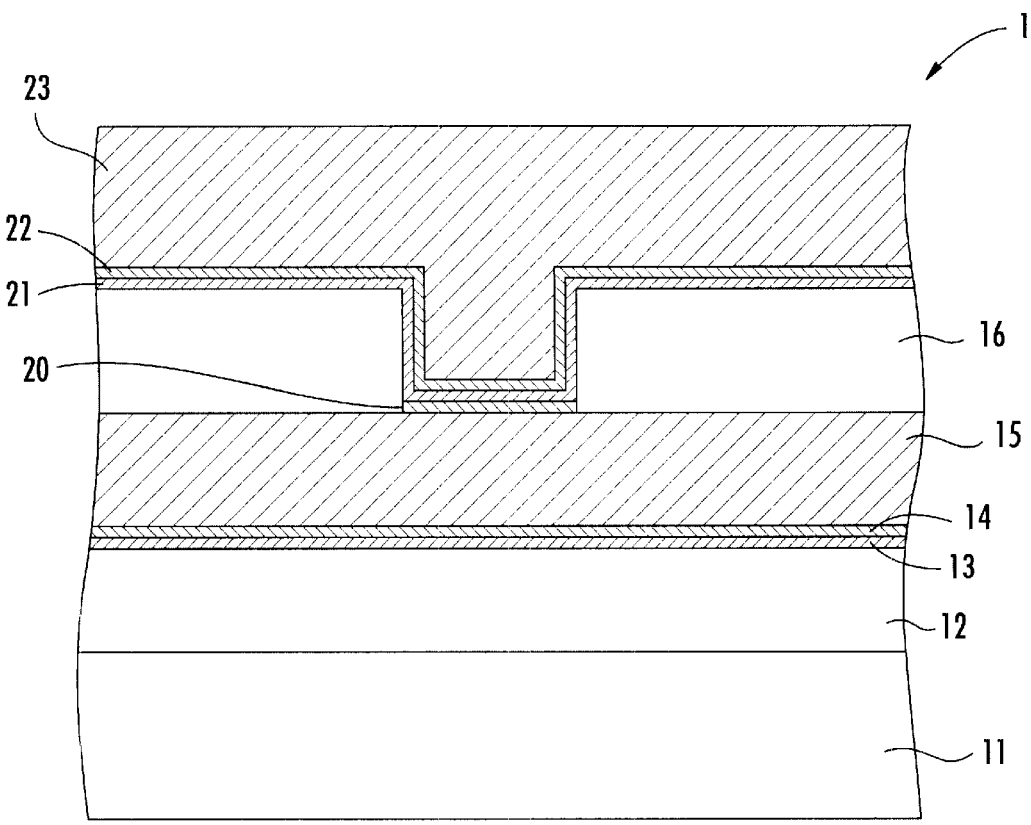
FIG. 1 is a schematic cross-sectional view of an integrated circuit device made in accordance with the present invention.

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout, and prime notation is used in an alternate embodiment to indicate similar elements.

Referring initially to FIGS. 1–4, the method for making an integrated circuit device 10 in accordance with the invention is first described. The device 10 includes a substrate 11 in which various doped regions (not shown) may be formed to define active devices, such as transistors, etc. as will be readily appreciated by those skilled in the art. One or more dielectric layers 12 may be formed over the substrate 11. The dielectric layer 12 may be patterned and etched and filled with metal, such as-copper or an alloy thereof, to define the copper interconnect line 15. As will also be appreciated by those skilled in the art, at least one barrier metal layer 13, and a copper seed layer 14 may be formed prior to electrodeposition of the copper interconnect 15. Those of skill in the art will appreciate that various etch stop layers may also be provided, however, these layers are not shown for clarity.

Figure 2:
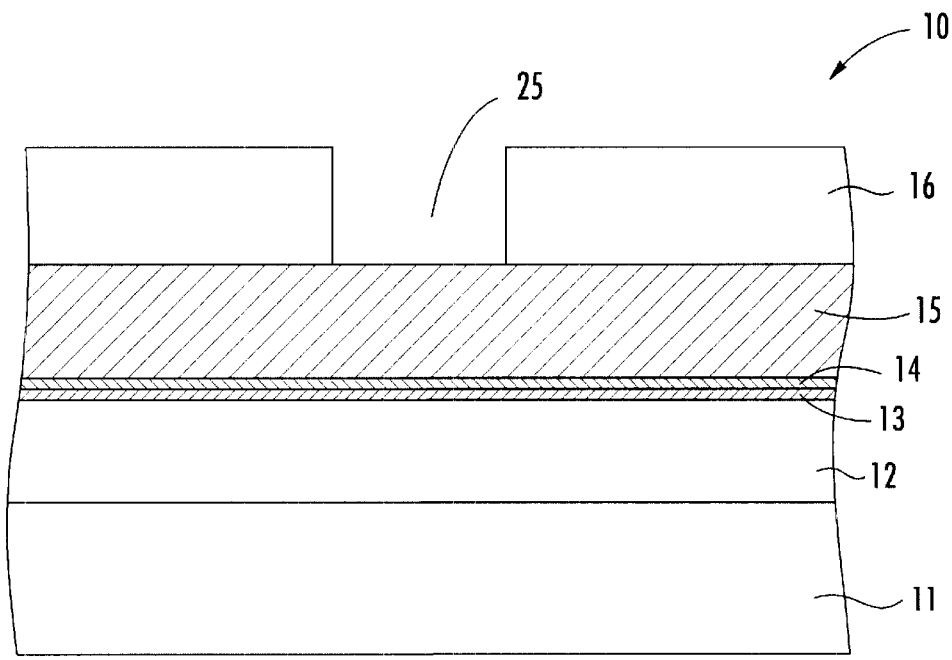
FIGS. 2 through 4 are schematic cross-sectional views of the integrated circuit device as shown in FIG. 1 during various processing steps.
Figure 3:
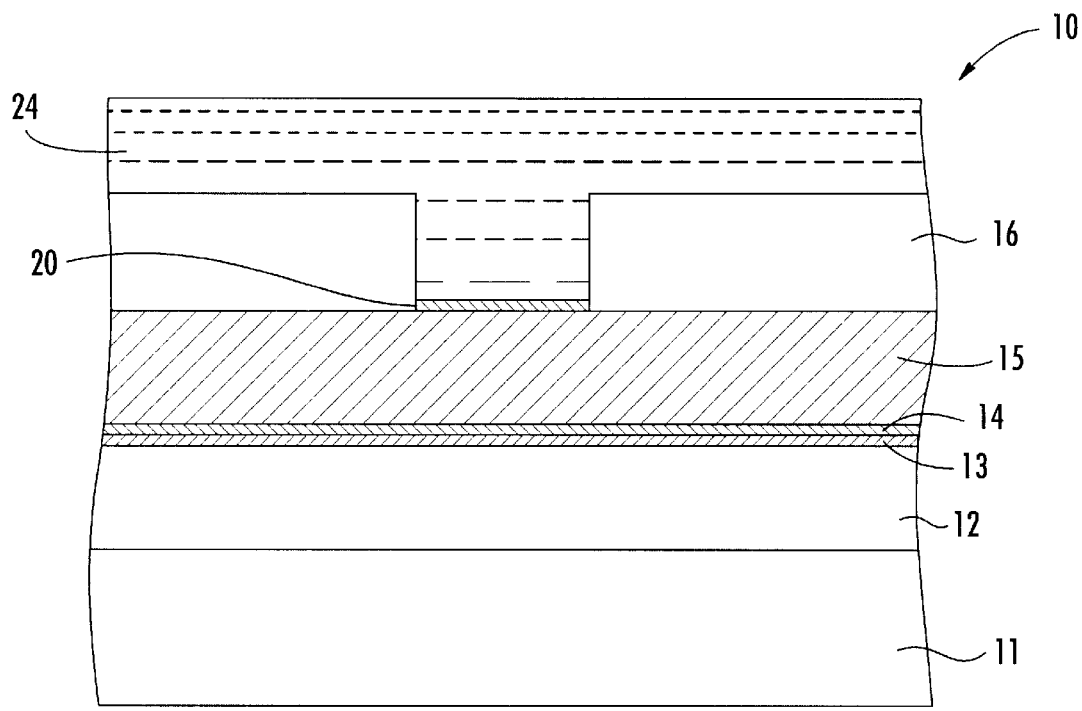

As shown in FIG. 2, an opening 25 may be formed extending through the dielectric layer 16 using conventional techniques. As shown in FIG. 3, the device 10 is subjected to a plating bath 24 including a plating metal more noble than copper. This forms a thin plating layer 20 on the exposed surface portion of the copper interconnect 15. This may be followed by an anneal which drives in the more noble metal a short distance into the copper, such that the electromigration resistance of the copper near the barrier layer 21 is greatly improved. This also passivates the exposed copper interconnect 15 improving its resistance to oxidation and staining. This process is readily implemented in a cost effective manner.

Figure 4:
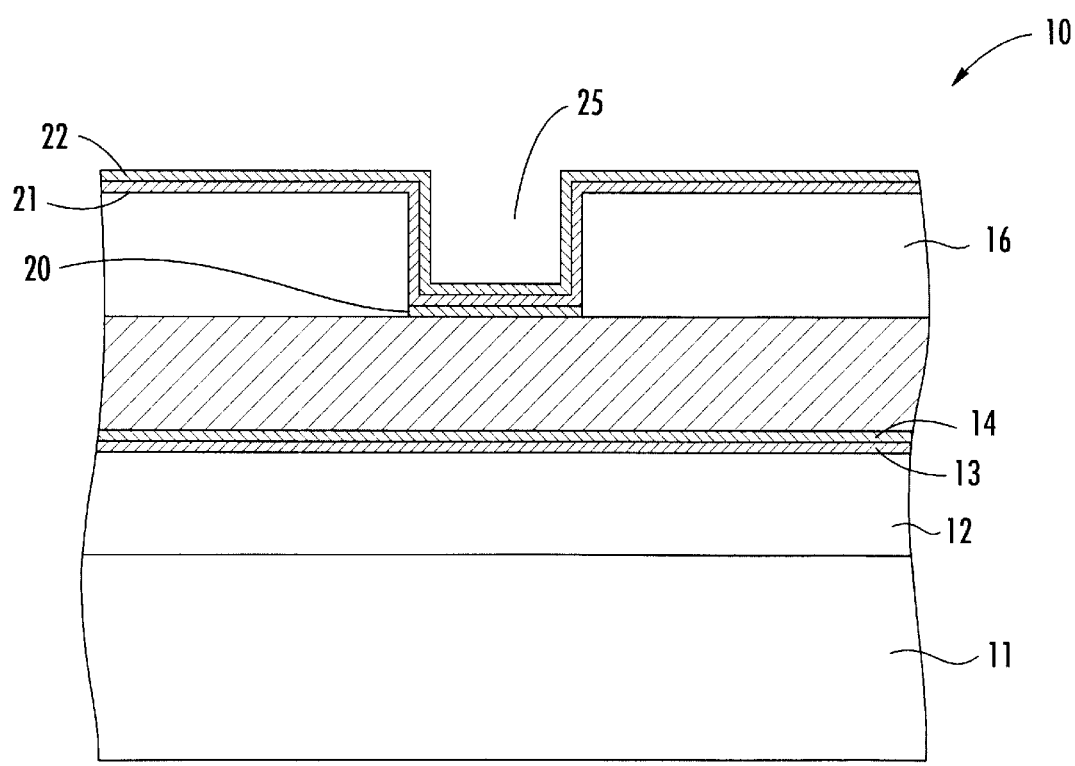

As shown in FIG. 4, a barrier layer 21 and a copper seed layer 22 may be formed to line the opening as will be appreciated by those skilled in the art. The barrier layer 21 may be tantalum nitride, tantalum silicon nitride, or other similar materials as will be appreciated by those skilled in the art. The resulting opening 25 may then be filled with copper, such as using copper electroplating techniques, for example, to form the structure shown in FIG. 1.

By selection of relatively inert metals, such as Pd or Pt, the invention also tends to passivate the temporarily exposed surface of the copper until the next step in the process is underway. This reduces oxidation and staining of the copper.

Alternatively, the copper interconnect 15 may be displacement plated following its delineation by CMP as is normally used in the Damascene approach as will be appreciated by those skilled in the art. In other words, in other embodiments, the entire upper surface could be displacement plated as described herein.

Several metals have higher reduction potentials than copper, that is, are more noble than copper. Selected reduction potentials are as follows: Ag+→Ag, 0.8 volts; Au+→Au, 1.7 volts; Pd++→Pd, 0.95 volts; Ir+++→Ir, 1.2 volts; Rh++→Rh, 0.6 volts; Hg++→Hg, 0.8 volts; Pt++→Pt, 1.2 volts. Copper itself exhibits a single electrode potential of Cu+→Cu, 0.52 volts. Any metal in a simple ion solution which has a reduction potential more positive than copper will spontaneously oxidize the copper and plate itself onto the copper as the metal. The displacement plating can be achieved using simple ion chemistries, such as sulfates or chlorides as will be appreciated by those skilled in the art. A monolayer or more will form depending on the porosity of the coating. A metal which is less noble than copper, such as cadmium, Cd+→Cd, −0.4 volts, will not undergo the displacement reaction with copper.

After the formation of the very thin metal coating or plating layer 20, an anneal is preferably performed sometime in the wafer processing flow so that the metal is driven into the copper a few atomic layers downward. For palladium, for example, considering the bulk diffusion constant of Pd through Cu, the diffusion length $\sqrt{Dt}$ for an anneal of one hour at 450° C. is about 100 Å. Thus a zone of roughly 100 Å of Cu+Pd alloy would be characterized by a marked increase in electromigration resistance due primarily, in this case, to a reduced rate of material transport from lattice diffusion processes.

Palladium and other metals listed above may not have ideal metallurgical characteristics which lend themselves towards the reduction of material transport rates due to high current density effects. In this case, however, the dopants would exist in high concentration. This is a factor which would tend to offset negative factors and which might contribute to their efficacy.

The deposition method described is not an electroless plating process. Thus, the coating or plating layer 20 thickness is self-limiting, and does not tend to coat the adjacent dielectric material 16. For this reason, the concentration of the metal in the aqueous plating bath 24 and the plating time are not critical as will be readily appreciated by those skilled in the art.

The rise in resistivity in the narrow zone of copper near the surface would be large with the high concentration of dopant. But, since the thickness of the effected layer is so narrow, the added via resistance would be small.

Such a treatment will tend to form a more stable transition from the barrier metal to the undoped or lightly-doped copper of the seed layer 22, reducing material transport rates during high current density periods.

In order to similarly protect the copper metal 23 on the upper side of the barrier layer 21, the seed layer 22 upon which the copper is plated may be sputter deposited with dopants. For example, the seed layer 22 could be 300–500 Å thick, sputter deposited, and contain 0.2 to 3 at. % Cd or Zn. The copper seed layer 22 could also include at least one of calcium, neodymium, tellurium, and ytterbium.

Figure 5:
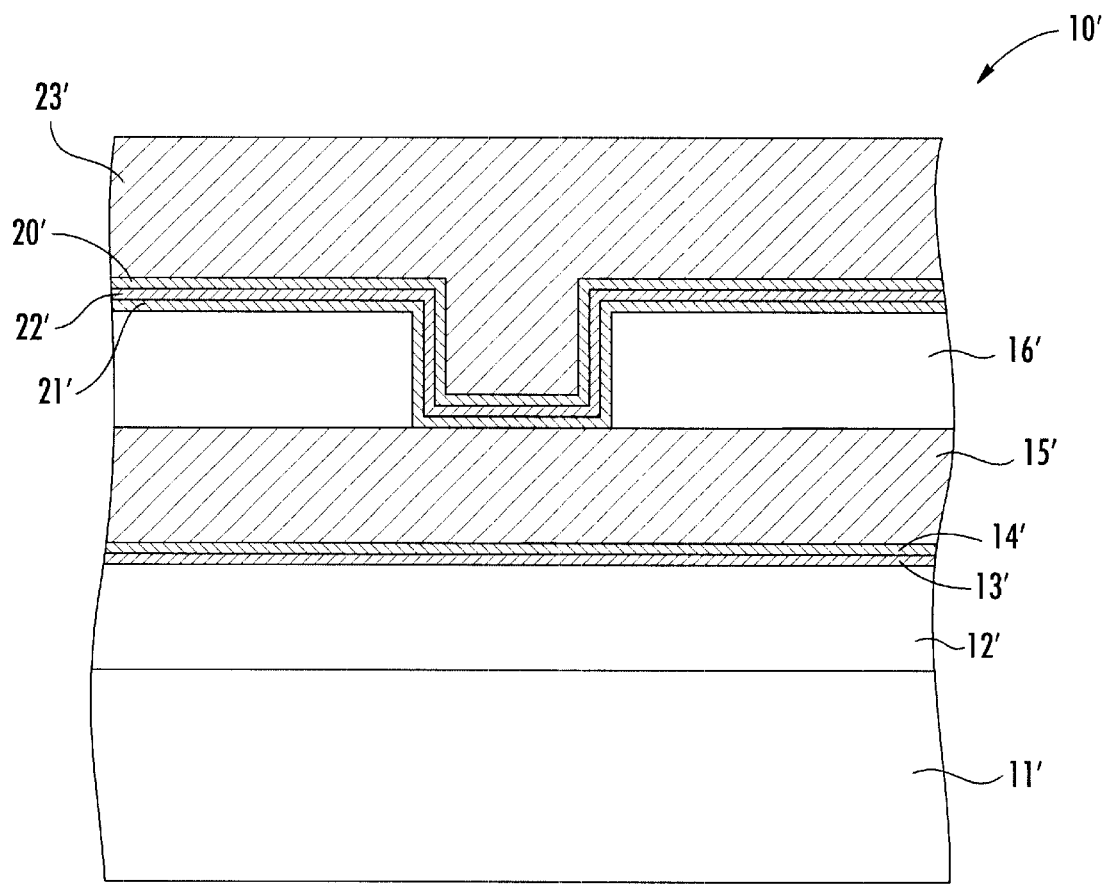
FIG. 5 is a schematic cross-sectional view of an integrated circuit device in accordance with an alternate embodiment of the invention.

Alternatively, as explained with reference to FIG. 5, the seed layer 22' could be undoped copper or one of the alloys mentioned above which is then displacement plated to form the plating layer 20' on the seed layer along the lines as described above. The main copper alloy layer 23' may then be plated on the displacement plating layer 20' as shown in the illustrated embodiment.

Other related concepts and discussions are provided in the following U.S. patent applications: Ser. No. 09/045,610, filed Mar. 20, 1998; Ser. No. 09/148,096 filed on Sep. 4, 1998; Ser. No. 09/271,179 filed on Mar. 17, 1999; Ser. No. 09/289,331 filed on Apr. 9, 19991; Serial No. 60/150,156 filed on Aug. 20, 1999; Serial No. 60/153,400 filed on Sep. 10, 1999; and Serial No. 60/159,068 filed on Oct. 12, 1999. The entire disclosure of each of these applications is incorporated herein by reference.

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that other modifications and embodiments are intended to be included within the scope of the appended claims.

That which is claimed is:

1. A method for making an integrated circuit device comprising:
   forming at least one interconnect structure adjacent a semiconductor substrate and comprising a copper portion and at least one barrier layer adjacent to the copper portion; and
   displacement plating surface portions of the copper portion with a plating metal more noble than copper and different than copper.

2. A method according to claim 1 wherein displacement plating comprises subjecting the copper portion to a plating bath including the plating metal.

3. A method according to claim 1 further comprising annealing the integrated circuit device after the displacement plating to diffuse the plating metal into the copper portion.

4. A method according to claim 3 wherein the displacement plating and annealing forms an electromigration resistant region having a thickness less than about 100 Å.

5. A method according to claim 1 wherein the plating metal comprises silver.

6. A method according to claim 1 wherein the plating metal comprises gold.

7. A method according to claim 1 wherein the plating metal comprises mercury.

8. A method according to claim 1 wherein the plating metal comprises rhodium.

9. A method according to claim 1 wherein the plating metal comprises palladium.

10. A method according to claim 1 wherein the plating metal comprises iridium.

11. A method according to claim 1 wherein the plating metal comprises platinum.

12. A method according to claim 1 wherein the copper portion comprises an interconnect line; and wherein displacement plating is performed after forming the interconnect line and before forming the at least one barrier layer.

13. A method according to claim 1 wherein the copper portion comprises a copper seed layer formed on the at least one barrier layer; and wherein displacement plating is performed after forming the seed layer on the at least one barrier layer.

14. A method according to claim 13 wherein the copper seed layer comprises a doped copper seed layer including at least one of calcium, cadmium, zinc, neodymium, tellurium, and ytterbium.

15. A method according to claim 13 further comprising electroplating additional copper on the displacement plated copper seed layer.

16. A method according to claim 1 further comprising forming a dielectric layer having at least one opening therein receiving portions of the at least one interconnect structure therein.

17. A method according to claim 1 wherein the at least one barrier layer comprises one of tantalum nitride and tantalum silicon nitride.

18. A method for making an integrated circuit device comprising:
   forming at least one copper interconnect line adjacent a semiconductor substrate; and
   displacement plating surface portions of the at least one copper interconnect line with a plating metal more noble than copper and different than copper.

19. A method according to claim 18 wherein displacement plating comprises subjecting surface portions of the at least one copper interconnect to a plating bath including the plating metal.

20. A method according to claim 18 further comprising annealing the integrated circuit device after the displacement plating to diffuse the plating metal into the at least one copper interconnect line.

21. A method according to claim 20 wherein the displacement plating and annealing forms an electromigration resistant region having a thickness less than about 100 Å.

22. A method according to claim 18 further comprising forming at least one barrier layer on the displacement plated surface portions of the at least one copper interconnect line.

23. A method according to claim 22 further comprising electroplating additional copper on the at least one barrier layer.

24. A method according to claim 22 wherein the at least one barrier layer comprises one of tantalum nitride and tantalum silicon nitride.

25. A method according to claim 18 further comprising forming a dielectric layer having at least one opening therein defining the surface portions of the at least one copper interconnect line for the displacement plating.

26. A method for making an integrated circuit device comprising:
   forming at least one barrier layer;
   forming a copper seed layer on the at least one barrier layer; and
   displacement plating surface portions of the copper seed layer opposite the at least one barrier layer with a plating metal more noble than copper and different than copper.

27. A method according to claim 26 wherein displacement plating comprises subjecting the copper seed layer to a plating bath including the plating metal.

28. A method according to claim 26 further comprising annealing the integrated circuit device after the displacement plating to diffuse the plating metal into the copper seed layer.

29. A method according to claim 28 wherein the displacement plating and annealing forms an electromigration resistant region having a thickness less than about 100 Å.

30. A method according to claim 26 wherein the plating metal comprises at least one of silver, gold, mercury, rhodium, palladium, iridium, and platinum.

31. A method according to claim 26 wherein the copper seed layer comprises a doped copper seed layer including at least one of calcium, cadmium, zinc, neodymium, tellurium, and ytterbium.

32. A method according to claim 26 further comprising electroplating additional copper on the displacement plated copper seed layer.

33. A method according to claim 26 wherein the at least one barrier layer comprises one of tantalum nitride and tantalum silicon nitride.

* * * * *